United States Patent
Kubota et al.

(10) Patent No.: US 12,227,087 B2
(45) Date of Patent: Feb. 18, 2025

(54) DIAGNOSIS SYSTEM, VEHICLE, METHOD, AND COMPUTER-READABLE STORAGE MEDIUM

(71) Applicant: HONDA MOTOR CO.,LTD., Tokyo (JP)

(72) Inventors: Atsushi Kubota, Saitama (JP); Fumihiro Yoshino, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 336 days.

(21) Appl. No.: 17/950,118

(22) Filed: Sep. 22, 2022

(65) Prior Publication Data
US 2023/0130035 A1    Apr. 27, 2023

(30) Foreign Application Priority Data
Oct. 26, 2021 (JP) ................. 2021-175040

(51) Int. Cl.
*B60L 3/00* (2019.01)
*B60L 3/12* (2006.01)
(Continued)

(52) U.S. Cl.
CPC ............ *B60L 3/0061* (2013.01); *B60L 3/12* (2013.01); *B60L 7/16* (2013.01); *B60L 58/12* (2019.02);
(Continued)

(58) Field of Classification Search
CPC .......... B60L 3/0061; B60L 3/12; B60L 58/12; B60L 7/16; B60L 2240/421;
(Continued)

(56) References Cited

U.S. PATENT DOCUMENTS

| | | | | |
|---|---|---|---|---|
| 6,316,842 B1 * | 11/2001 | Kuroda | ................ | B60L 50/61 290/40 C |
| 2009/0095063 A1 | 4/2009 | Kanamori | | |
| 2017/0267113 A1 * | 9/2017 | Harada | ................ | B60L 3/0084 |
| 2018/0375459 A1 | 12/2018 | Tsugawa | | |
| 2022/0176940 A1 * | 6/2022 | Kim | ................ | B60W 10/26 |

FOREIGN PATENT DOCUMENTS

| | | |
|---|---|---|
| JP | H0719292 U | 4/1995 |
| JP | 2008116316 A | 5/2008 |

(Continued)

OTHER PUBLICATIONS

Office Action issued for counterpart Japanese Application No. 2021-175040, issued by the Japanese Patent Office on Apr. 4, 2023 (drafted on Mar. 28, 2023).

(Continued)

*Primary Examiner* — Edwin A Young (57) ABSTRACT

A diagnosis system performs, while a vehicle is being driven, a diagnosis of a rotation portion of a rotating electrical machine included in the vehicle. The diagnosis system includes a measurement unit that, when performing the diagnosis of the rotation portion, stops charging of a storage battery included in the vehicle from the rotating electrical machine, and measures an inductive voltage of the rotating electrical machine generated by a rotation of the rotation portion, and a judgment unit that judges that there is an anomaly in the rotation portion when a magnitude of the inductive voltage is equal to or larger than a predetermined value.

20 Claims, 8 Drawing Sheets

(51) Int. Cl.
   *B60L 7/16*      (2006.01)
   *B60L 58/12*     (2019.01)
   *G01R 19/00*     (2006.01)
   *G01R 31/34*     (2020.01)
   *G07C 5/02*      (2006.01)
   *G07C 5/08*      (2006.01)

(52) U.S. Cl.
   CPC ....... *G01R 19/0084* (2013.01); *G01R 31/343* (2013.01); *G07C 5/02* (2013.01); *G07C 5/0816* (2013.01); *B60L 2240/421* (2013.01); *B60L 2240/427* (2013.01)

(58) Field of Classification Search
   CPC .......... B60L 2240/427; G01R 19/0084; G01R 31/343; G07C 5/0816
   See application file for complete search history.

(56) References Cited

FOREIGN PATENT DOCUMENTS

| | | |
|---|---|---|
| JP | 2011122799 A | 6/2011 |
| WO | 2017110855 A1 | 6/2017 |

OTHER PUBLICATIONS

Yoshio Yoshikuwa et al, "Development of Ultralow Noise Motors by Using Windings as a Sensor (Noise Reduction of Motors by Realizing an Eccentricity of Under One Micrometer)", Transactions of the Japan Society of Mechanical Engineers, The Japan Society of Mechanical Engineers, 2018, pp. 1-16, vol. 84, issue 861.

* cited by examiner

DIAGNOSIS SYSTEM, VEHICLE, METHOD, AND COMPUTER-READABLE STORAGE MEDIUM

The contents of the following Japanese patent application(s) are incorporated herein by reference:
NO. 2021-175040 filed on Oct. 26, 2021.

BACKGROUND

1. Technical Field

The present invention relates to a diagnosis system, a vehicle, a method, and a computer-readable storage medium.

2. Related Art

Patent Document 1 describes an apparatus that causes a current to flow through a wire belt and senses a breakage of the belt when the flow of the current stops due to the breakage of the belt. Non-Patent Document 1 describes a method of detecting a shaft deviation of a rotor and a stator by using a change of a winding impedance that is due to a change of a positional relationship between the rotor and the stator.

PRIOR ART DOCUMENTS

Patent Document

Patent Document 1: Japanese Unexamined Utility Model Application No. H7-19292

Non-Patent Document

Non-Patent Document 1: "DEVELOPMENT OF ULTRALOW NOISE MOTORS BY USING WINDINGS AS A SENSOR (NOISE REDUCTION OF MOTORS BY REALIZING AN ECCENTRICITY OF UNDER ONE MICROMETER)" by Yoshio Yoshikuwa et al., Transactions of The Japan Society of Mechanical Engineers, The Japan Society of Mechanical Engineers, 2018, volume 84, issue 861, pages 17-00450

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solving means of the invention.

Figure 1:
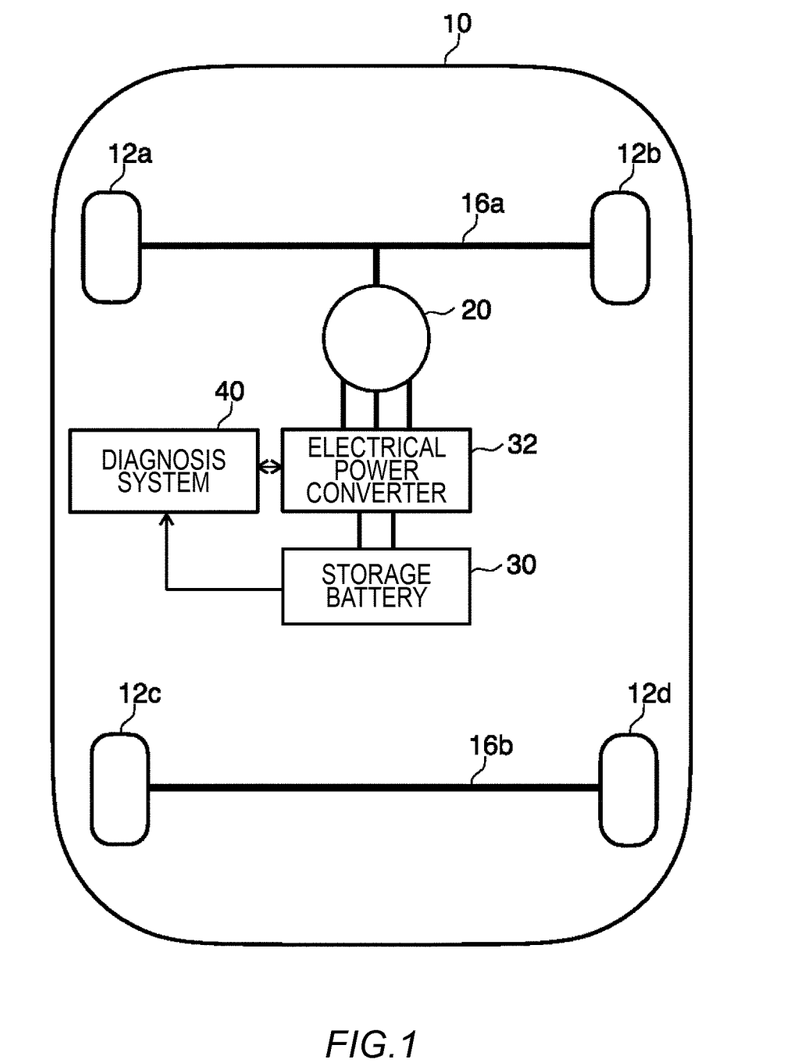
FIG. 1 shows a block configuration of a vehicle 10.

FIG. 1 shows a block configuration of a vehicle 10. The vehicle 10 is, for example, an electric vehicle. The vehicle 10 may be a hybrid electric vehicle or the like.

The vehicle 10 includes a rotating electrical machine 20, a storage battery 30, an electrical power converter 32, a diagnosis system 40, axles 16a and 16b, and wheels 12a, 12b, 12c, and 12d. The axle 16a is coupled to the two wheels 12a and 12b, and the axle 16b is coupled to the two wheels 12c and 12d. An output shaft of the rotating electrical machine 20 is coupled to the axle 16a via a torque transmission mechanism. The axle 16a transmits a driving force of the output shaft of the rotating electrical machine 20 to the wheels 12a and 12b.

The rotating electrical machine 20 functions as both an electrical motor for vehicle driving and a regenerative power generator. The storage battery 30 is a power source for driving the rotating electrical machine 20. Electrical energies accumulated in the storage battery 30 are converted into alternate currents by the electrical power converter 32 to thus be supplied to the rotating electrical machine 20. When decelerating the vehicle 10, the rotating electrical machine 20 converts a braking energy into electrical power so as to generate AC power, and the AC power is converted into DC power by the electrical power converter 32 to thus be accumulated in the storage battery 30.

The diagnosis system 40 performs a diagnosis of the rotating electrical machine 20. In the present embodiment, the diagnosis of the rotating electrical machine 20 means judging whether there is an anomaly in the rotating electrical machine 20, for example. In particular, the diagnosis system 40 performs the diagnosis of the rotating electrical machine 20 while the vehicle 10 is being driven. When performing the diagnosis of the rotating electrical machine 20 while the vehicle 10 is being driven, the diagnosis system 40 stops charging of the storage battery 30 from the rotating electrical machine 20 by stopping the electrical power conversion by the electrical power converter 32. The diagnosis system 40 measures an inductive voltage generated in the rotating electrical machine 20 while the charging of the storage battery 30 from the rotating electrical machine 20 is stopped. The diagnosis system 40 judges that there is an anomaly in the rotating electrical machine 20 when a magnitude of the inductive voltage generated in the rotating electrical machine 20 while the charging of the storage battery 30 from the rotating electrical machine 20 is stopped is equal to or larger than a predetermined value.

Figure 2:
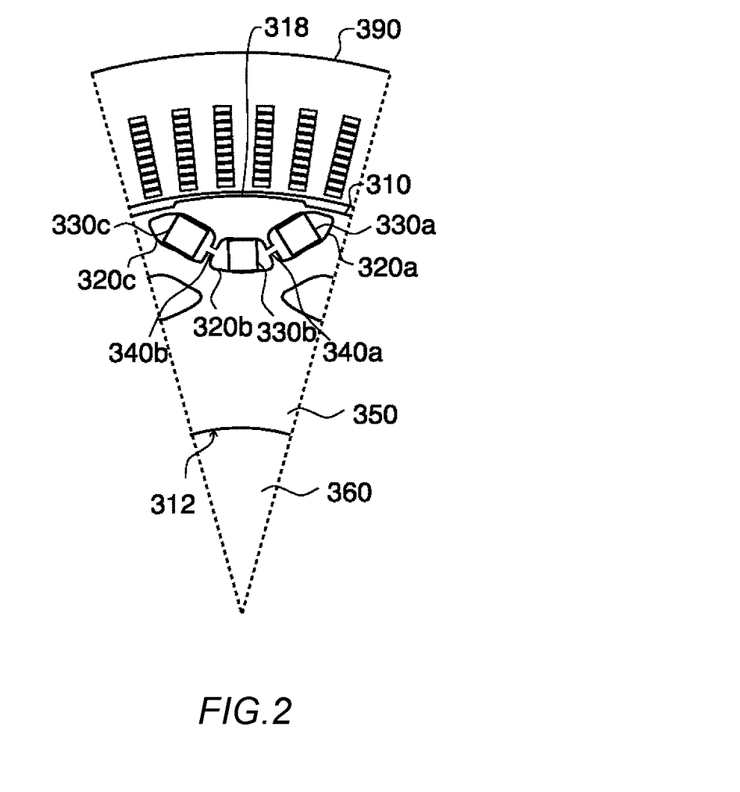
FIG. 2 schematically shows an example of a partial cross section of a rotating electrical machine 20 having an anomaly.

FIG. 2 schematically shows an example of a partial cross section of the rotating electrical machine 20 having an anomaly. The rotating electrical machine 20 is an inner rotor type rotating electrical machine, for example. The rotating electrical machine 20 is a permanent-magnet-embedded type rotating electrical machine (IPM motor), for example.

The rotating electrical machine 20 includes a rotation portion 310 and a fixing portion 390. The fixing portion 390 opposes the rotation portion 310 via a slight gap on an outer side of the rotation portion 310 in a radial direction. The fixing portion 390 is a so-called stator.

The rotation portion 310 is a so-called rotor. The rotation portion 310 includes a rotation shaft 360, a core portion 312, and a plurality of permanent magnets including permanent magnets 330a, 330b, and 330c. The plurality of permanent magnets including the permanent magnets 330a, 330b, and 330c are embedded in the core portion 312.

The core portion 312 is formed by a steel sheet laminated body in which a plurality of magnetic steel sheets 350 are laminated along the rotation shaft 360. The rotation shaft 360 is inserted at a center portion of the magnetic steel sheets 350. The magnetic steel sheet 350 includes a plurality of magnet insertion holes including magnet insertion holes 320a, 320b, and 320c at an outer circumference thereof. The plurality of permanent magnets including the permanent magnets 330a, 330b, and 330c are inserted into the plurality of magnet insertion holes formed in the plurality of magnetic steel sheets 350. In the rotating electrical machine 20, the three permanent magnets inserted into the three magnet insertion holes function as a single magnetic pole portion.

FIG. 2 shows a state where a gap 340a is generated by a breakage between the magnet insertion holes 320a and 320b in the magnetic steel sheet 350, and a gap 340b is generated by a breakage between the magnet insertion holes 320b and 320c. Due to the generation of the gaps 340a and 340b, a protrusion 318 that protrudes in the radial direction with the rotation shaft of the rotating electrical machine 20 being a center, is formed. By an interval with respect to the fixing portion 390 being narrowed by the protrusion 318, a magnetic circuit changes. Accordingly, the inductive voltage generated in the rotating electrical machine 20 becomes higher than that in a case where the protrusion 318 is not formed in the rotating electrical machine 20.

As described above, the diagnosis system 40 measures the inductive voltage of the rotating electrical machine 20 in a state where the charging of the storage battery 30 is stopped while the vehicle 10 is being driven, and judges that there is an anomaly in the rotating electrical machine 20 when the inductive voltage is equal to or larger than a predetermined value. On the other hand, the diagnosis system 40 judges that the rotating electrical machine 20 is normal when the inductive voltage is smaller than the predetermined value. Accordingly, since the change of the inductive voltage accompanying the change of the magnetic circuit due to the generation of the gaps can be detected, there is no need to provide a stress sensor or the like in the rotation portion 310. Therefore, it becomes possible to detect a possibility of an anomaly in the rotation portion 310 without complicating a structure of the rotating electrical machine 20.

Figure 3:
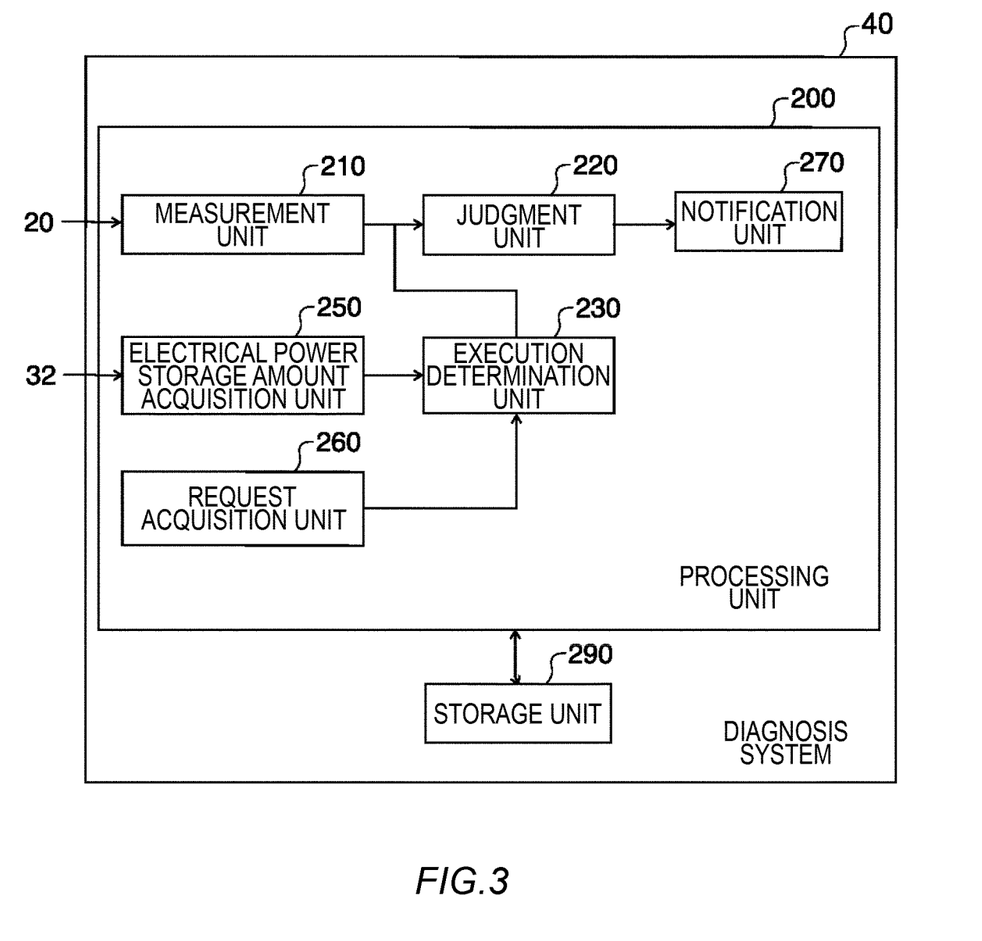
FIG. 3 schematically shows a block configuration of a diagnosis system 40.

FIG. 3 schematically shows a block configuration of the diagnosis system 40. The diagnosis system 40 includes a processing unit 200 and a storage unit 290.

The storage unit 290 is realized by including a nonvolatile storage medium. For example, the processing unit 200 is realized by a circuit of a calculation processing apparatus including a processor, or the like. The processing unit 200 performs processing using information stored in the storage unit 290. The processing unit 200 may be realized by a microcomputer including a CPU, a ROM, a RAM, an I/O, a bus, and the like. At least a part of the diagnosis system 40 may be realized by one or more ECUs (Electronic Control Units).

The processing unit 200 of the diagnosis system 40 performs a diagnosis of the rotation portion 310 of the rotating electrical machine 20 included in the vehicle 10 while the vehicle 10 is being driven. The processing unit 200 includes a measurement unit 210, a judgment unit 220, an execution determination unit 230, an electrical power storage amount acquisition unit 250, a request acquisition unit 260, and a notification unit 270.

When performing the diagnosis of the rotation portion 310, the measurement unit 210 stops charging of the storage battery 30 included in the vehicle 10 from the rotating electrical machine 20 and measures the inductive voltage of the rotating electrical machine 20 that is generated by the rotation of the rotation portion 310. For example, as well as stopping the charging of the storage battery 30 by stopping the electrical power conversion by the electrical power converter 32, the measurement unit 210 may acquire a detection result of an output voltage of the rotating electrical machine 20 from the electrical power converter 32. Since the inductive voltage is measured after stopping the charging of the storage battery 30 included in the vehicle 10 from the rotating electrical machine 20, an anomaly of the rotation portion 310 can be determined using an inductive voltage obtained while the rotating electrical machine 20 is in a no load state.

The judgment unit 220 judges that there is an anomaly in the rotation portion 310 when a magnitude of the inductive voltage of the rotating electrical machine 20 is equal to or larger than a predetermined value. When the magnitude of the inductive voltage of the rotating electrical machine 20 is equal to or larger than the predetermined value, the notification unit 270 notifies the anomaly of the rotation portion 310. For example, the notification unit 270 may notify a passenger of the vehicle 10 by displaying that an anomaly has occurred on an instrument panel of the vehicle 10. The notification unit 270 may notify the passenger of the vehicle 10 that an anomaly has occurred using an HMI (Human-Machine Interface) function of the vehicle 10.

The request acquisition unit 260 acquires an acceleration request of the vehicle 10. The request acquisition unit 260 may acquire a press-down operation of an accelerator pedal that is operated by a driver of the vehicle 10, as the acceleration request. When the vehicle 10 is under automated driving, the request acquisition unit 260 may acquire an acceleration request output from an automated driving control portion of the vehicle 10.

When performing the diagnosis of the rotation portion 310, the diagnosis system 40 sets, with respect to a brake request, a mode for activating a machine brake included in the vehicle 10 instead of activating a regenerative brake by the rotating electrical machine 20. Accordingly, braking by the machine brake can be performed even when the regenerative brake does not function due to the stop of the electrical power converter 32 for measuring the inductive voltage in the no load state.

The execution determination unit 230 determines that the diagnosis of the rotation portion 310 is to be executed when an acceleration of the vehicle 10 is not requested. For example, the execution determination unit 230 determines that the diagnosis of the rotation portion 310 is to be executed when the request acquisition unit 260 has not acquired the acceleration request of the vehicle 10. Accordingly, it becomes possible not to measure the inductive voltage when there is an acceleration request of the vehicle 10. When the inductive voltage of the rotating electrical machine 20 in the no load state is measured when there is an acceleration request, responsiveness with respect to the acceleration request deteriorates. In contrast, since the execution determination unit 230 determines that the diagnosis of the rotation portion 310 is to be executed when the acceleration of the vehicle 10 is not requested, deterioration of the responsiveness with respect to the acceleration request can be suppressed.

The electrical power storage amount acquisition unit 250 acquires an electrical power storage amount of the storage battery 30. The execution determination unit 230 determines that the diagnosis of the rotation portion 310 is to be executed when the electrical power storage amount of the storage battery 30 is equal to or larger than a predetermined reference value. As the electrical power storage amount of the storage battery 30 becomes higher, it becomes less necessary to perform regenerative charging. Therefore, since an operation of sensing an anomaly of the rotation portion 310 can be performed when the necessity of charging the storage battery 30 is low, it becomes possible to suppress a situation where the charging of the storage battery 30 is inhibited more than necessary.

The predetermined value may be a value determined using a value set at a time of shipment of the vehicle 10. The predetermined value may be a value determined based on a plurality of inductive voltages measured in a past period. The predetermined value may be determined based on a mean value of the plurality of inductive voltages measured in a past period. The predetermined value may be determined based on a weighted average efficiency of the plurality of inductive voltages measured in a past period. Accordingly, a value to be used for judging an anomaly of the rotation portion 310 can be updated as the rotating electrical machine 20 is used.

The judgment unit 220 may judge that there is an anomaly in the rotation portion 310 when a frequency component of the inductive voltage in a frequency domain that is equal to or larger than a multiple of integer of an electrical angle rotation speed of the rotation portion 310 is larger than a predetermined value and the integer is larger than one. The judgment unit 220 may judge that there is an anomaly in the rotation portion 310 when a frequency component of the inductive voltage in a frequency domain that is equal to or larger than 40 times an electrical angle rotation speed of the rotation portion 310 is equal to or larger than a predetermined value. The judgment unit 220 judges that there is an anomaly in the rotation portion 310 when a value obtained by normalizing the inductive voltage by a rotation speed is equal to or larger than a predetermined value.

Figure 4:
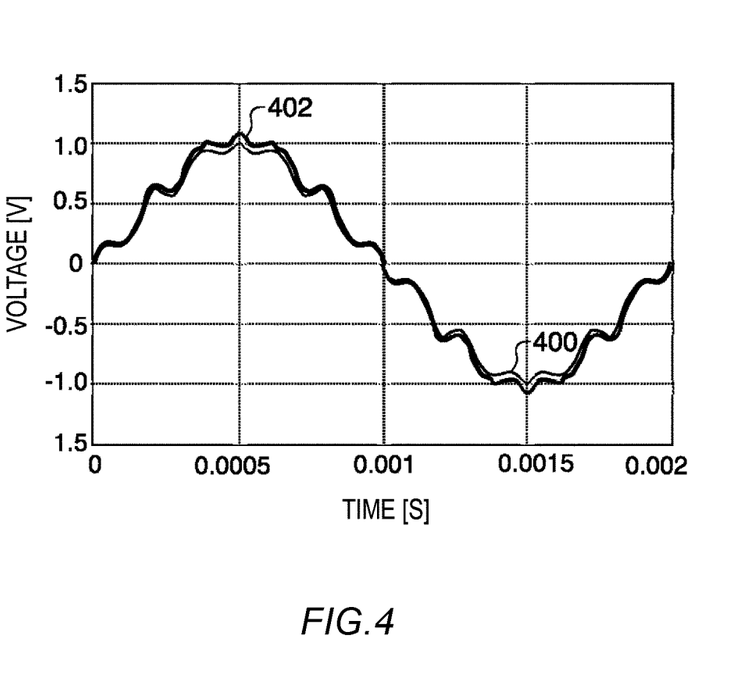
FIG. 4 is a graph showing frequency characteristics of an inductive voltage of the rotating electrical machine 20.

FIG. 4 is a graph showing an example of temporal changes of the inductive voltages of the rotating electrical machine 20. A horizontal axis in the graph of FIG. 4 represents time, and a vertical axis represents a voltage. A fine line 400 indicates an example of the temporal change of the inductive voltage when there is no anomaly in the rotation portion 310. A thick line 402 indicates an example of the temporal change of the inductive voltage when there is an anomaly in the rotation portion 310. As shown in FIG. 4, an amplitude of the inductive voltage of the rotating electrical machine 20 when there is an anomaly in the rotation portion 310 becomes larger than that when there is no anomaly in the rotation portion 310. Therefore, the judgment unit 220 may judge that there is an anomaly in the rotation portion 310 when a magnitude of the measured inductive voltage of the rotating electrical machine 20 exceeds a predetermined value.

Figure 5:
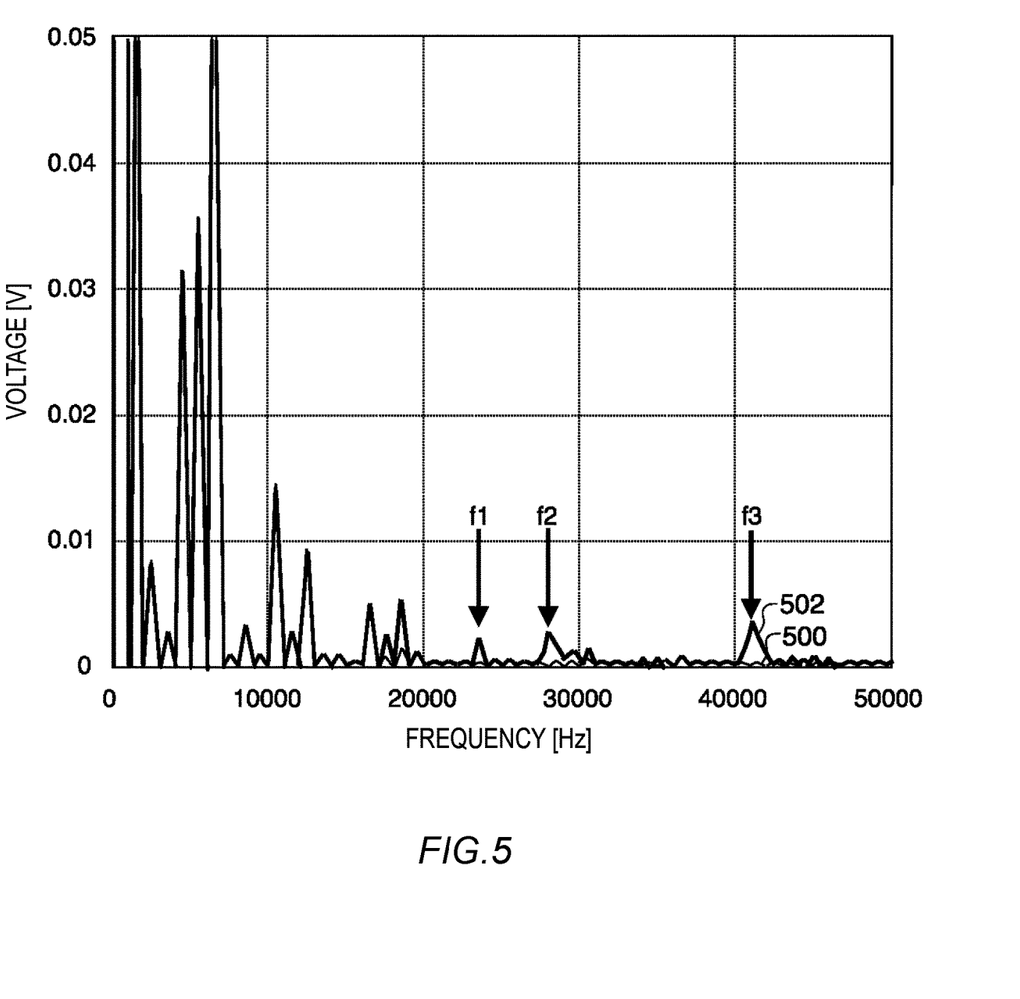
FIG. 5 is a graph showing the frequency characteristics of the inductive voltage of the rotating electrical machine 20.

FIG. 5 is a graph showing frequency characteristics of the inductive voltage of the rotating electrical machine 20. A horizontal axis in the graph of FIG. 5 represents a frequency, and a vertical axis represents a voltage. A fine line 500 indicates a frequency component obtained by subjecting time series data of the inductive voltage obtained when there is no anomaly in the rotation portion 310 to Fourier transform. A thick line 502 indicates a frequency component obtained by subjecting time series data of the inductive voltage obtained when there is an anomaly in the rotation portion 310 to Fourier transform. As shown in FIG. 5, comparing the case where there is an anomaly in the rotation portion 310 and the case where there is no anomaly, it can be seen that the frequency component of the inductive voltage obtained when there is an anomaly in the rotation portion 310 is prominently larger than the frequency component of the inductive voltage obtained when there is no anomaly in the rotation portion 310 at frequencies f1, f2, and f3 in a high frequency domain.

Therefore, the judgment unit 220 calculates a frequency component of the measured inductive voltage of the rotating electrical machine 20 and compares, in a frequency domain higher than a predetermined frequency, the calculated value of the frequency component of the inductive voltage with a predetermined value of the frequency component, to thus judge whether there is an anomaly in the rotation portion 310. For example, the judgment unit 220 may judge that there is an anomaly in the rotation portion 310 when the calculated value of the frequency component of the inductive voltage is larger than a value obtained by multiplying the predetermined value of the frequency component by a predetermined coefficient larger than one.

Figure 6:
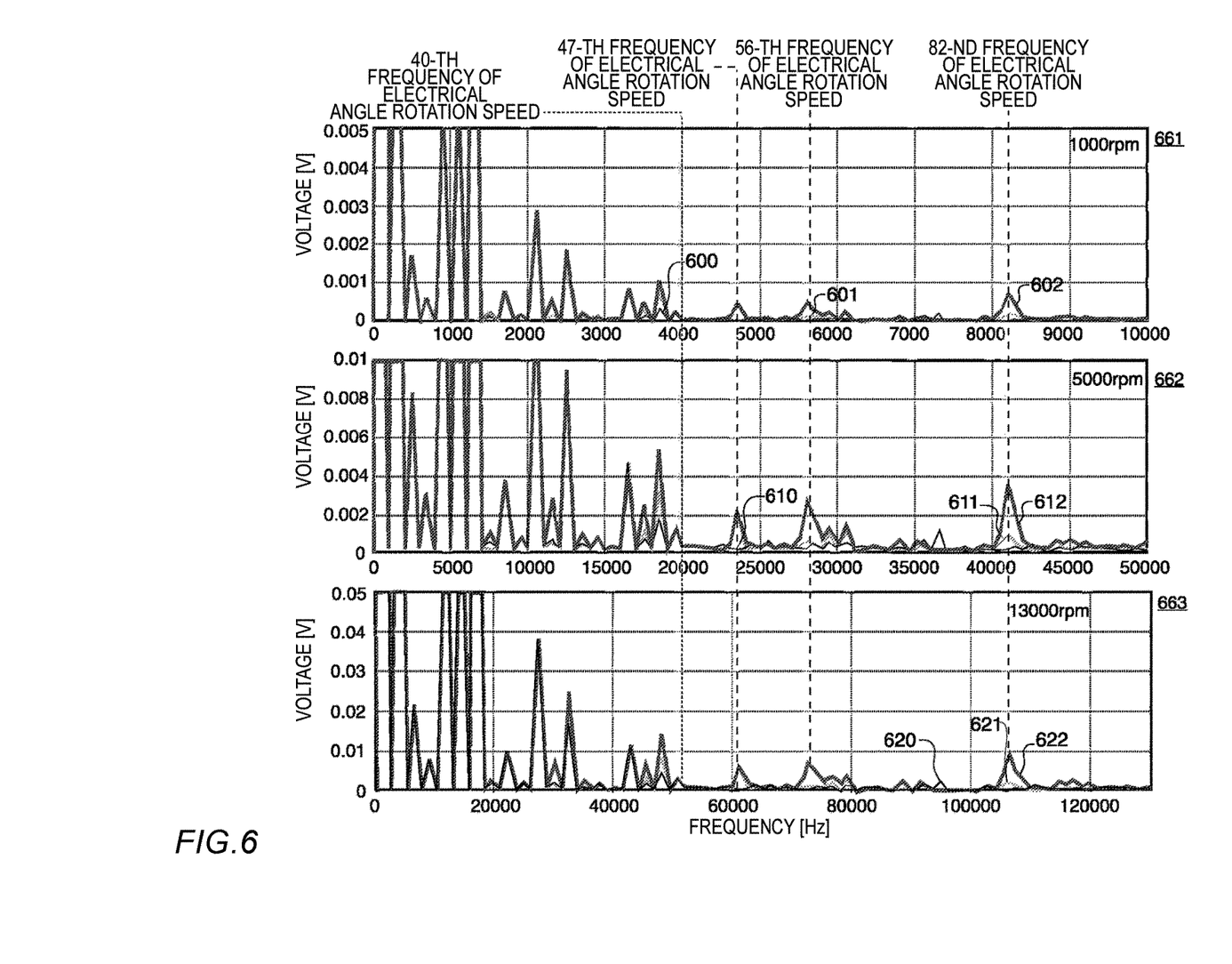
FIG. 6 shows graphs each showing the frequency characteristics of the inductive voltage of the rotating electrical machine 20 per rotation speed of a rotation portion 310.

FIG. 6 shows graphs that show frequency characteristics of inductive voltages of the rotating electrical machine 20 per rotation speed of the rotation portion 310. FIG. 6 shows a graph 661 of frequency characteristics of an inductive voltage when a rotation speed of the rotation portion 310 is 1,000 rpm, a graph 662 of frequency characteristics of an inductive voltage when the rotation speed of the rotation portion 310 is 5,000 rpm, and a graph 663 of frequency characteristics of an inductive voltage when the rotation speed of the rotation portion 310 is 13,000 rpm. Horizontal axes in the three graphs of FIG. 6 each represent a frequency, and vertical axes each represent a voltage. Note that, with the rotating electrical machine 20 which is a six-pole motor being an analysis target, FIG. 6 shows inductive voltages in a non load state that have been calculated in three cases including a case where there is no anomaly in the rotation portion 310, a case where there is a breakage in one pole of one magnetic steel sheet 350 of the rotation portion 310, and a case where there is a breakage in one pole of one magnetic steel sheet 350 of the rotation portion 310 and gaps as shown in FIG. 2 are generated.

A fine line 600 in the graph 661 indicates an example of the frequency characteristics of the inductive voltage when there is no anomaly in the rotation portion 310. A medium sized line 601 in the graph 661 indicates an example of the frequency characteristics of the inductive voltage when there is a breakage in the magnetic steel sheet 350 of the rotation portion 310 but no gap is generated. A thick line 602 in the graph 661 indicates an example of the frequency characteristics of the inductive voltage when there is a breakage in the magnetic steel sheet 350 of the rotation portion 310 and gaps are generated. A fine line 610 in the graph 662 indicates an example of the frequency characteristics of the inductive voltage when there is no anomaly in the rotation portion 310, a medium sized line 611 in the graph 662 indicates an example of the frequency characteristics of the inductive voltage when there is a breakage in the magnetic steel sheet 350 of the rotation portion 310 but no gap is generated, and a thick line 612 in the graph 662 indicates an example of the frequency characteristics of the inductive voltage when there is a breakage in the magnetic steel sheet 350 of the rotation portion 310 and gaps are generated. In addition, a fine line 620 in the graph 663 indicates an example of the frequency characteristics of the inductive voltage when there is no anomaly in the rotation portion 310, a medium sized line 621 in the graph 663 indicates an example of the frequency characteristics of the inductive voltage when there is a breakage in the magnetic steel sheet 350 of the rotation portion 310 but no gap is generated, and a thick line 622 in the graph 663 indicates an example of the frequency characteristics of the inductive voltage when there is a breakage in the magnetic steel sheet 350 of the rotation portion 310 and gaps are generated.

As shown in FIG. 6, in a 47-th frequency of the electrical angle rotation speed, a 56-th frequency of the electrical angle rotation speed, and an 82-nd frequency of the electrical angle rotation speed, there are clear peaks in at least the frequency components obtained when there are gaps in the magnetic steel sheet 350, and there are no clear peaks in the frequency components obtained when there is no anomaly in the magnetic steel sheet 350.

When the rotation speed of the rotation portion 310 is 1,000 rpm, in the 47-th frequency of the electrical angle rotation speed, the frequency component of the inductive voltage when gaps are generated in the magnetic steel sheet 350 is about 11.6 times the frequency component of the inductive voltage when there is no anomaly in the rotation portion 310. In addition, in the 56-th frequency of the electrical angle rotation speed, the frequency component of the inductive voltage when gaps are generated in the magnetic steel sheet 350 is about 11.6 times the frequency component of the inductive voltage when there is no anomaly in the rotation portion 310. In addition, in the 82-nd frequency of the electrical angle rotation speed, the frequency component of the inductive voltage when gaps are generated in the magnetic steel sheet 350 is about 16.7 times the frequency component of the inductive voltage when there is no anomaly in the rotation portion 310.

When the rotation speed of the rotation portion 310 is 5,000 rpm, in the 47-th frequency of the electrical angle rotation speed, the frequency component of the inductive voltage when gaps are generated in the magnetic steel sheet 350 is about 11.4 times the frequency component of the inductive voltage when there is no anomaly in the rotation portion 310. In addition, in the 56-th frequency of the electrical angle rotation speed, the frequency component of the inductive voltage when gaps are generated in the magnetic steel sheet 350 is about 11.5 times the frequency component of the inductive voltage when there is no anomaly in the rotation portion 310. In addition, in the 82-nd frequency of the electrical angle rotation speed, the frequency component of the inductive voltage when gaps are generated in the magnetic steel sheet 350 is about 16.1 times the frequency component of the inductive voltage when there is no anomaly in the rotation portion 310.

When the rotation speed of the rotation portion 310 is 13,000 rpm, in the 47-th frequency of the electrical angle rotation speed, the frequency component of the inductive voltage when gaps are generated in the magnetic steel sheet 350 is about 11.3 times the frequency component of the inductive voltage when there is no anomaly in the rotation portion 310. In addition, in the 56-th frequency of the electrical angle rotation speed, the frequency component of the inductive voltage when gaps are generated in the magnetic steel sheet 350 is about 11.3 times the frequency component of the inductive voltage when there is no anomaly in the rotation portion 310. In addition, in the 82-nd frequency of the electrical angle rotation speed, the frequency component of the inductive voltage when gaps are generated in the magnetic steel sheet 350 is about 16.0 times the frequency component of the inductive voltage when there is no anomaly in the rotation portion 310.

As described above, in the frequency domain of the 47-th frequency of the electrical angle rotation speed or more, when gaps are generated in the magnetic steel sheet 350, it can be seen that there are a plurality of frequencies where the frequency component of the inductive voltage that is equal to or larger than 10 times the frequency component of the inductive voltage when there is no anomaly in the rotation portion 310, is obtained. Therefore, the judgment unit 220 may judge that there is an anomaly in the rotation portion 310 when there is at least one frequency where a frequency component that is equal to or larger than 10 times a normal value indicating the frequency component of the inductive voltage when there is no anomaly in the rotation portion 310, is obtained in a frequency domain higher than a predetermined frequency, for example. Here, the "predetermined frequency" may be a 40-th frequency of the electrical angle rotation speed of the rotation portion 310 or frequencies higher than the 40-th frequency. The "predetermined frequency" may be a 30-th frequency of the electrical angle rotation speed of the rotation portion 310 or frequencies higher than the 30-th frequency. In general, the "predetermined frequency" may be a frequency that is a multiple of integer of the electrical angle rotation speed of the rotation portion 310, the integer being larger than one.

The "value of the frequency component when there is no anomaly in the rotation portion 310" may be a value that is preset as a normal value at a time of shipment of the vehicle 10. The normal value may be a value that is obtained by actually measuring the inductive voltage before shipment of the rotating electrical machine 20. By using the normal value that is based on the actual measurement value of the inductive voltage of the rotating electrical machine 20 obtained at the time of shipment as described above, it becomes possible to be less affected by an individual difference of the rotating electrical machine 20.

Further, the "value of the frequency component when there is no anomaly in the rotation portion 310" may be a normal value calculated based on values of a plurality of inductive voltages that have been measured when the diagnosis system 40 performs the diagnosis of the rotating electrical machine 20 a plurality of times after shipment of the vehicle 10. The normal value may be a value that is calculated based on frequency components of N inductive voltages that have been measured when the diagnosis is most recently performed N times. The normal value may be a mean value of the frequency components of N inductive voltages that have been measured when the diagnosis is most recently performed N times. The normal value may be a maximum value of the frequency components of N inductive voltages that have been measured when the diagnosis is most recently performed N times. N may be a predetermined number of times.

Also by using the normal value that is calculated based on the values of the inductive voltages that have been measured when the diagnosis system 40 performs the diagnosis of the rotating electrical machine 20 after shipment of the vehicle 10 as described above, it becomes possible to be less affected by an individual difference of the rotating electrical machine 20. In addition, a range presumed to be the normal value may sometimes change when the rotating electrical machine 20 is used for a long time. Even in such a case, by calculating the normal value using the actual measurement values of the inductive voltages that have been measured when the diagnosis is most recently performed N times, it may become possible to surely sense an anomaly such as a breakage and a gap of the rotation portion 310 as well as suppress false sensing.

In general, the inductive voltage of the rotating electrical machine 20 is proportional to the rotation speed of the rotation portion 310. Therefore, the judgment unit 220 may judge an anomaly of the rotation portion 310 using a value obtained by normalizing the frequency component of the inductive voltage by the rotation speed of the rotation portion 310. Accordingly, the judgment unit 220 can compare the value obtained by normalizing the frequency component of the inductive voltage by the rotation speed of the rotation portion 310 with a particular normal value irrespective of a vehicle speed of the vehicle 10 or the rotation speed of the rotation portion 310, and judge an anomaly of the rotation portion 310.

Figure 7:
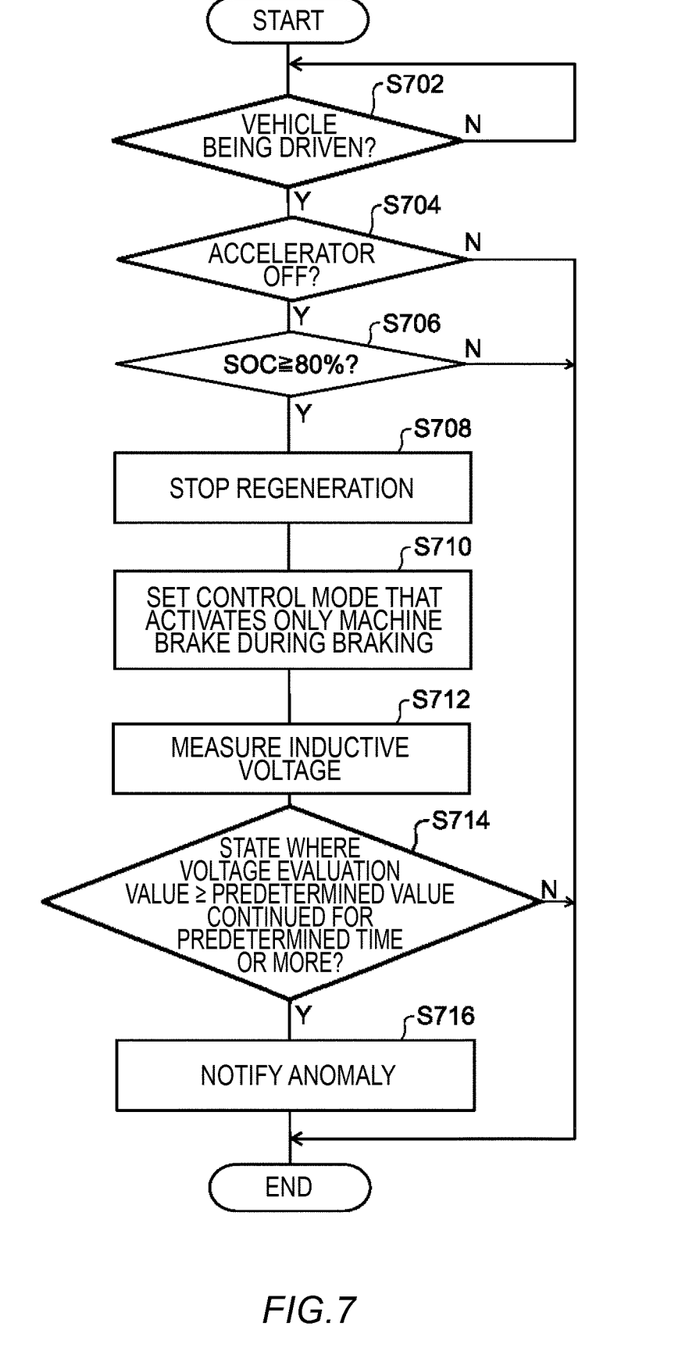
FIG. 7 is an example of a flowchart related to a diagnosis method according to the diagnosis system 40.

FIG. 7 is an example of a flowchart related to a diagnosis method according to the diagnosis system 40. In S702, the execution determination unit 230 determines whether the vehicle 10 is being driven. When the vehicle 10 is not being driven, the determination of S702 is repeated.

In S704, the execution determination unit 230 judges whether an accelerator is off. For example, the execution determination unit 230 judges whether the driver of the vehicle 10 has performed an accelerator off operation. When the vehicle 10 is under automated driving despite the operation made by the driver of the vehicle 10, the execution determination unit 230 may judge whether control to stop an acceleration has been performed. When judged that the accelerator is not off in S704, the processing of this flowchart is ended. When judged that the accelerator is off in S704, the processing advances to S706.

In S706, the execution determination unit 230 judges whether a remaining amount of the storage battery 30 is equal to or larger than a predetermined reference value. As shown in FIG. 7, an SOC of the storage battery 30 may be used as the remaining amount of the storage battery 30. In addition, the predetermined reference value may be 80%. When judged that the remaining amount of the storage battery 30 is smaller than the predetermined reference value in S706, the processing of this flowchart is ended. When judged that the remaining amount of the storage battery 30 is equal to or larger than the predetermined reference value in S706, the processing advances to S708.

In S708, the measurement unit 210 stops energy regeneration from the rotating electrical machine 20 to the storage battery 30. For example, the measurement unit 210 stops an operation of the electrical power converter 32 to convert electrical power generated in the rotating electrical machine 20 into DC power for charging the storage battery 30.

In S710, the diagnosis system 40 sets, as a control mode related to braking of the vehicle 10, a control mode for activating a machine brake included in the vehicle 10 with respect to a brake request instead of activating the regenerative brake by the rotating electrical machine 20.

In S712, the measurement unit 210 measures an inductive voltage of the rotating electrical machine 20. For example, the measurement unit 210 acquires a measurement result of an output voltage of the rotating electrical machine 20 from a voltage sensor included in the electrical power converter 32, to thus measure the inductive voltage of the rotating electrical machine 20.

In S714, the judgment unit 220 judges whether a state where an evaluation value of the inductive voltage is equal to or larger than a predetermined value has continued for a predetermined time or more. The predetermined time may be a time of, for example, about 0.6 seconds. Note that the "evaluation value of the inductive voltage" may be a value of an inductive voltage itself. The "evaluation value of the inductive voltage" may be a frequency component of a particular frequency domain that is obtained by performing conversion processing such as FFT on time series data of the inductive voltage so as to convert it into a frequency domain. When judged in S714 that the state where the evaluation value of the inductive voltage is equal to or larger than a predetermined value has not continued for the predetermined time or more, the processing of this flowchart is ended. When judged in S714 that the state where the evaluation value of the inductive voltage is equal to or larger than a predetermined value has continued for the predetermined time or more, the processing advances to S716.

In S716, the notification unit 270 notifies at least one of the driver, passenger, or owner of the vehicle 10 that there is a possibility that an anomaly has occurred in the rotation portion 310. Accordingly, at least one of the driver, passenger, or owner of the vehicle 10 can recognize that there is a possibility that an anomaly has occurred in the rotation portion 310. Note that a notification destination for notifying an anomaly by the notification unit 270 may be a notification destination preregistered in the diagnosis system 40.

Note that the processing of this flowchart described in relation to FIG. 7 may be started periodically every time a predetermined time elapses.

As described above, according to the diagnosis system 40, an anomaly of the rotation portion 310 can be sensed using a fact that an inductive voltage of the fixing portion 390 changes along with the change of the magnetic circuit that is caused by the anomaly of the rotation portion 310. Accordingly, it becomes possible to sense an anomaly of the rotation portion 310 without providing a stress sensor or the like in the rotation portion 310 and monitoring it. Therefore, it becomes possible to sense an anomaly of the rotation portion without complicating the structure of the rotating electrical machine. In addition, there is no need to additionally provide a slide portion for transmitting signals, and reliability of measurement values is not impaired due to an effect of noises. Accordingly, it becomes possible to promptly sense fatigue breakdown of the magnetic steel sheet or a sign of the fatigue breakdown with higher accuracy. Therefore, the rotating electrical machine can be used for a long time until nearly reaching a product lifetime.

Note that the vehicle 10 is an example of a transport equipment. The transport equipment includes an automobile such as a passenger vehicle or a bus, a saddle-ride type vehicle, a bicycle, and the like. The transport equipment is one example of a moving object. The diagnosis system 40 is applicable to a diagnosis of a rotating electrical machine included in any moving object.

Figure 8:
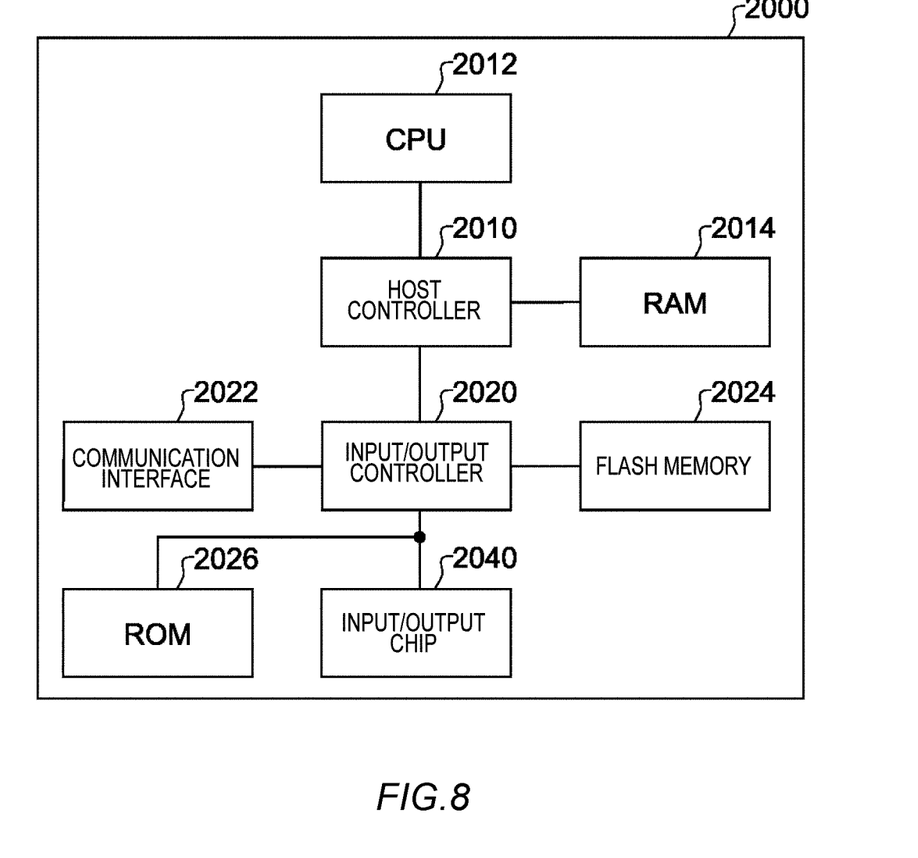
FIG. 8 shows an example of a computer 2000.

FIG. 8 shows an example of a computer 2000 where a plurality of embodiments of the present invention may be entirely or partially embodied. A program installed in the computer 2000 can cause the computer 2000 to function as each unit of the diagnosis system 40 according to the embodiment, execute operations associated with the system or each unit of the system, and/or execute processes according to the embodiment or steps of the processes. Such a program may be executed by a CPU 2012 to cause the computer 2000 to execute the specific operation associated with some or all of the blocks of processing procedures and block diagrams described in the present specification.

The computer 2000 according to the present embodiment includes the CPU 2012 and a RAM 2014, which are mutually connected by a host controller 2010. The computer 2000 also includes a ROM 2026, a flash memory 2024, a communication interface 2022, and an input/output chip 2040. The ROM 2026, the flash memory 2024, the communication interface 2022, and the input/output chip 2040 are connected to the host controller 2010 via an input/output controller 2020.

The CPU 2012 operates according to the program stored in the ROM 2026 and the RAM 2014, thereby controlling each unit.

The communication interface 2022 communicates with other electronic devices via a network. The flash memory 2024 stores the program and data used by the CPU 2012 in the computer 2000. The ROM 2026 stores therein a boot program or the like executed by the computer 2000 at the time of activation, and/or a program depending on the hardware of the computer 2000. In addition, the input/output chip 2040 may connect various input/output units such as a keyboard, a mouse, and a monitor to the input/output controller 2020 via an input/output port such as a serial port, a parallel port, a keyboard port, a mouse port, a monitor port, a USB port, and an HDMI (registered trademark) port.

The program is provided via a network or a computer-readable medium such as a CD-ROM, a DVD-ROM, or a memory card. The RAM 2014, the ROM 2026, or the flash memory 2024 is an example of the computer-readable medium. The program is installed in the flash memory 2024, the RAM 2014, or the ROM 2026, and is executed by the CPU 2012. Information processing described in the program is read by the computer 2000, thereby resulting in cooperation between the program and the above-described various types of hardware resources. An apparatus or method may be constituted by realizing the operation or processing of information in accordance with the usage of the computer 2000.

For example, when communication is executed between the computer 2000 and an external device, the CPU 2012 may execute a communication program loaded in the RAM 2014, and instruct the communication interface 2022 to process the communication based on the processing written in the communication program. The communication interface 2022, under the control of the CPU 2012, reads out transmission data stored in a transmission buffer processing area provided in a recording medium such as the RAM 2014 and the flash memory 2024, transmits the read transmission data to the network, and writes a reception data received from the network into a reception buffer processing area or the like provided on the recording medium.

In addition, the CPU 2012 may cause all or a necessary portion of a file or a database to be read into the RAM 2014, the file or the database having been stored in the recording medium such as the flash memory 2024, etc., and execute various types of processing on the data on the RAM 2014. The CPU 2012, then, writes back the processed data into the recording medium.

Various types of information, such as various types of programs, data, tables, and databases, may be stored in the recording medium to undergo information processing. The CPU 2012 may be configured to execute, on the data read from the RAM 2014, various types of processing including various types of operations, information processing, conditional judgment, conditional branching, unconditional branching, search and replacement of information, and the like described in the present specification and specified by instruction sequences of the programs, and to write a result back to the RAM 2014. In addition, the CPU 2012 may search for information in a file, a database, or the like in the recording medium. For example, when a plurality of entries, each having an attribute value of a first attribute associated with an attribute value of a second attribute, are stored in the recording medium, the CPU 2012 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The program or software module described above may be stored in a computer-readable medium on the computer 2000 or near the computer 2000. A recording medium such as a hard disk or a RAM provided in a server system connected to a dedicated communication network or the Internet can be used as a computer-readable medium. The program stored in the computer-readable medium may be provided to the computer 2000 via the network.

Programs that are installed in the computer 2000 and cause the computer 2000 to function as the diagnosis system 40 may cooperate with the CPU 2012 or the like to cause the computer 2000 to function as each unit of the diagnosis system 40. By being read by the computer 2000, the information processing written in these programs functions as each unit of the diagnosis system 40 as specific means in which software and the various hardware resources described above cooperate with one another. Further, by realizing calculations or processing of information according to an intended use of the computer 2000 of the present embodiment by these specific means, a unique diagnosis system 40 that meets the intended use is structured.

Various embodiments have been described with reference to the block diagrams and the like. In the block diagram, each block may represent (1) a step of a process in which an operation is executed, or (2) each unit of the apparatus having a role of executing the operation. Specific steps and each unit may be implemented by a dedicated circuit, a programmable circuit supplied along with a computer-readable instruction stored on a computer-readable medium, and/or a processor supplied along with the computer-readable instruction stored on the computer-readable medium. The dedicated circuit may include a digital and/or analog hardware circuit, or may include an integrated circuit (IC) and/or a discrete circuit. The programmable circuit may include reconfigurable hardware circuits including logical AND, logical OR, logical XOR, logical NAND, logical NOR, and other logical operations, memory elements such as a flip-flop, a register, a field programmable gate array (FPGA), and a programmable logic array (PLA), and the like.

The computer-readable medium may include any tangible device capable of storing an instruction to be executed by an appropriate device, so that the computer-readable medium having the instruction stored thereon constitutes at least a part of a product including an instruction that may be executed in order to provide means to execute an operation specified by a processing procedure or a block diagram. Examples of the computer-readable medium may include an electronic storage medium, a magnetic storage medium, an optical storage medium, an electromagnetic storage medium, a semiconductor storage medium, and the like. More specific examples of the computer-readable medium may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a Blu-ray (registered trademark) disc, a memory stick, an integrated circuit card, and the like.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++, etc., and conventional procedural programming languages, such as the "C" programming language or similar programming languages.

Computer-readable instructions may be provided to a processor of a general-purpose computer, special purpose computer, or other programmable data processing apparatuses, or to a programmable circuit, locally or via a local area network (LAN), wide area network (WAN) such as the Internet, so that the computer-readable instructions are executed to create means for performing operations specified in the described processing procedures or block diagrams. Examples of the processor include a computer processor, a processing unit, a microprocessor, a digital signal processor, a controller, a microcontroller, and the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: vehicle
12: wheel
16: axle
20: rotating electrical machine
30: storage battery
32: electrical power converter
40: diagnosis system
200: processing unit
210: measurement unit
220: judgment unit
230: execution determination unit
250: electrical power storage amount acquisition unit
260: request acquisition unit
270: notification unit
290: storage unit
310: rotation portion
312: core portion
318: protrusion
320: magnet insertion hole
330: permanent magnet
340: gap
350: magnetic steel sheet
360: rotation shaft
390: fixing portion
400: fine line
402: thick line
500: fine line
502: thick line
600: fine line
601: medium sized line
602: thick line
610: fine line
611: medium sized line
612: thick line
620: fine line
621: medium sized line
622: thick line
661, 662, 663: graph
2000: computer
2010: host controller
2012: CPU
2014: RAM
2020: input/output controller
2022: communication interface
2024: flash memory
2026: ROM
2040: input/output chip

What is claimed is:

1. A diagnosis system configured to perform, while a vehicle is being driven, a diagnosis of a rotation portion of a rotating electrical machine included in the vehicle, the diagnosis system comprising:
a measurement unit configured to, when performing the diagnosis of the rotation portion, stop charging of a storage battery included in the vehicle from the rotating electrical machine and measure an inductive voltage of the rotating electrical machine generated by a rotation of the rotation portion; and
a judgment unit configured to judge that there is an anomaly in the rotation portion when a magnitude of the inductive voltage is equal to or larger than a predetermined value.

2. The diagnosis system according to claim 1, further comprising:
a notification unit configured to notify that there is the anomaly in the rotation portion when the magnitude of the inductive voltage is equal to or larger than the predetermined value.

3. The diagnosis system according to claim 2, wherein
when performing the diagnosis of the rotation portion, a mode for activating, with respect to a brake request, a machine brake included in the vehicle without activating a regenerative brake by the rotating electrical machine is set.

4. The diagnosis system according to claim 2, further comprising:
an execution determination unit configured to determine that the diagnosis of the rotation portion is to be executed when an acceleration of the vehicle is not requested.

5. The diagnosis system according to claim 2, further comprising:
an electrical power storage amount acquisition unit configured to acquire an electrical power storage amount of the storage battery; and
an execution determination unit configured to determine that the diagnosis of the rotation portion is to be executed when the electrical power storage amount of the storage battery is equal to or larger than a predetermined reference value.

6. The diagnosis system according to claim 2, wherein
the predetermined value is a value determined using a value set at a time of shipment of the vehicle.

7. The diagnosis system according to claim 2, wherein
the predetermined value is a value determined based on a plurality of the inductive voltages measured in a past period.

8. The diagnosis system according to claim 2, wherein
the judgment unit is configured to judge that there is the anomaly in the rotation portion when a frequency component of the inductive voltage in a frequency domain equal to or larger than a multiple of integer of an electrical angle rotation speed of the rotation portion is larger than the predetermined value and the integer is larger than 1.

9. The diagnosis system according to claim 1, wherein
when performing the diagnosis of the rotation portion, a mode for activating, with respect to a brake request, a machine brake included in the vehicle without activating a regenerative brake by the rotating electrical machine is set.

10. The diagnosis system according to claim 9, further comprising:
an execution determination unit configured to determine that the diagnosis of the rotation portion is to be executed when an acceleration of the vehicle is not requested.

11. The diagnosis system according to claim 1, further comprising:
an execution determination unit configured to determine that the diagnosis of the rotation portion is to be executed when an acceleration of the vehicle is not requested.

12. The diagnosis system according to claim 1, further comprising:
an electrical power storage amount acquisition unit configured to acquire an electrical power storage amount of the storage battery; and
an execution determination unit configured to determine that the diagnosis of the rotation portion is to be executed when the electrical power storage amount of the storage battery is equal to or larger than a predetermined reference value.

13. The diagnosis system according to claim 1, wherein
the predetermined value is a value determined using a value set at a time of shipment of the vehicle.

14. The diagnosis system according to claim 1, wherein
the predetermined value is a value determined based on a plurality of the inductive voltages measured in a past period.

15. The diagnosis system according to claim 1, wherein
the judgment unit is configured to judge that there is the anomaly in the rotation portion when a frequency component of the inductive voltage in a frequency domain equal to or larger than a multiple of integer of an electrical angle rotation speed of the rotation portion is larger than the predetermined value and the integer is larger than 1.

16. The diagnosis system according to claim 1, wherein
the judgment unit is configured to judge that there is the anomaly in the rotation portion when a frequency component of the inductive voltage in a frequency domain equal to or larger than 40 times an electrical angle rotation speed of the rotation portion is equal to or larger than the predetermined value.

17. The diagnosis system according to claim 1, wherein
the judgment unit is configured to judge that there is the anomaly in the rotation portion when a value obtained by normalizing the inductive voltage by a rotation speed is equal to or larger than the predetermined value.

18. A vehicle comprising:
the diagnosis system according to claim 1.

19. A method of performing, while a vehicle is being driven, a diagnosis of a rotation portion of a rotating electrical machine included in the vehicle, the method comprising:
when performing the diagnosis of the rotation portion, stopping charging of a storage battery included in the vehicle from the rotating electrical machine and measuring an inductive voltage of the rotating electrical machine generated by a rotation of the rotation portion; and
judging that there is an anomaly in the rotation portion when a magnitude of the inductive voltage is equal to or larger than a predetermined value.

20. A non-transitory computer-readable storage medium having stored thereon a program for a diagnosis system, the diagnosis system being configured to perform, while a vehicle is being driven, a diagnosis of a rotation portion of a rotating electrical machine included in the vehicle, the program being configured to, when executed by a computer, cause the computer to function as:
a measurement unit configured to, when performing the diagnosis of the rotation portion, stop charging of a storage battery included in the vehicle from the rotating electrical machine and measure an inductive voltage of the rotating electrical machine generated by a rotation of the rotation portion; and
a judgment unit configured to judge that there is an anomaly in the rotation portion when a magnitude of the inductive voltage is equal to or larger than a predetermined value.

* * * * *